United States Patent
Li et al.

(10) Patent No.: US 10,839,975 B2
(45) Date of Patent: Nov. 17, 2020

(54) GRAPHENE COATED ELECTRONIC COMPONENTS

(71) Applicant: The Boeing Company, Seal Beach, CA (US)

(72) Inventors: Angela W. Li, Everett, WA (US); Jeffrey H. Hunt, Thousand Oaks, CA (US); Wayne R. Howe, Irvine, CA (US)

(73) Assignee: THE BOEING COMPANY, Chicago, IL (US)

( * ) Notice: Subject to any disclaimer, the term of this patent is extended or adjusted under 35 U.S.C. 154(b) by 346 days.

(21) Appl. No.: 14/202,623

(22) Filed: Mar. 10, 2014

(65) Prior Publication Data
US 2015/0255184 A1 Sep. 10, 2015

(51) Int. Cl.
*H01B 1/00* (2006.01)
*H01B 1/04* (2006.01)
(Continued)

(52) U.S. Cl.
CPC ............ *H01B 1/04* (2013.01); *C01B 32/184* (2017.08); *H01B 13/22* (2013.01); *H01L 21/56* (2013.01);
(Continued)

(58) Field of Classification Search
CPC ......... H01B 13/22; H01L 21/56; H01L 23/29; C01B 2204/04
See application file for complete search history.

(56) References Cited

U.S. PATENT DOCUMENTS

| 6,025,784 A | * | 2/2000 | Mish | G08G 1/017 340/693.5 |
| 6,548,912 B1 | * | 4/2003 | Graff | H01L 23/3192 257/758 |

(Continued)

FOREIGN PATENT DOCUMENTS

| EP | 2 104 141 A2 | 9/2009 |
| EP | 2 269 948 A1 | 1/2011 |

(Continued)

OTHER PUBLICATIONS

"Improved Electrical Conductivity of Graphene Films Integrated with Metal Nanowires", Iskandar N. Kholmanov, Carl W. Magnuson, Ali E. Aliev Huifeng Li, Bin Zhang, Ji Won Suk, Li Li Zhang, Eric Peng, S. Hossein Mousavi, Alexander B. Khanikaev, Richard Piner, Gennady Shvets, and Rodney S. Ruoff, Nano Lett. 2012, 12, 5679-5683.*

(Continued)

*Primary Examiner* — David P Turocy
*Assistant Examiner* — Mohammad Mayy
(74) *Attorney, Agent, or Firm* — MH2 Technology Law Group LLP (57) ABSTRACT

In one aspect, coated electrical components are described herein. In some implementations, a coated electrical component comprises an electrical component and a graphene coating layer disposed on a surface of the electrical component. The graphene coating layer, in some implementations, has a thickness of about 300 nm or less. In another aspect, methods of increasing the service life of an electronic apparatus are disclosed herein. In some implementations, such a method comprises disposing a graphene coating layer on an environment-facing surface of an electronic component of the apparatus, wherein the electronic apparatus exhibits at least a 10 percent improvement in environmental testing performance compared to an otherwise equivalent (Continued)

electronic apparatus not comprising a graphene coating layer, the environmental testing performance comprising performance in a waterproofness test, acetic acid test, sugar solution test, or methyl alcohol test described herein.

17 Claims, 1 Drawing Sheet (51) Int. Cl.
| | |
|---|---|
| H01B 13/22 | (2006.01) |
| H01L 21/56 | (2006.01) |
| H01L 23/29 | (2006.01) |
| C01B 32/184 | (2017.01) |
| B82Y 30/00 | (2011.01) |
| B82Y 40/00 | (2011.01) |

(52) U.S. Cl.
CPC .............. *H01L 23/29* (2013.01); *B82Y 30/00* (2013.01); *B82Y 40/00* (2013.01); *C01B 2204/04* (2013.01); *H01L 2924/0002* (2013.01); *Y10T 428/265* (2015.01)

(56) References Cited

U.S. PATENT DOCUMENTS

| | | | |
|---|---|---|---|
| 8,263,843 B2 | 9/2012 | Kim et al. | |
| 2004/0009346 A1* | 1/2004 | Jang | B82Y 10/00 428/336 |
| 2005/0126338 A1* | 6/2005 | Yadav | B82Y 30/00 75/255 |
| 2006/0145825 A1* | 7/2006 | Mc Call | B60R 25/2045 340/426.35 |
| 2008/0061609 A1* | 3/2008 | Williamson | B60K 35/00 297/217.3 |
| 2008/0248275 A1 | 10/2008 | Jang et al. | |
| 2009/0269560 A1* | 10/2009 | Dhinojwala | B81C 1/00111 428/206 |
| 2010/0092809 A1* | 4/2010 | Drzal | H01M 4/0416 429/413 |
| 2010/0112373 A1* | 5/2010 | Coffey | B32B 33/00 428/608 |
| 2010/0203340 A1* | 8/2010 | Ruoff | C23C 8/64 428/408 |
| 2010/0265041 A1* | 10/2010 | Almog | G06K 19/07749 340/10.1 |
| 2011/0032678 A1 | 2/2011 | Altman et al. | |
| 2011/0049437 A1 | 3/2011 | Crain et al. | |
| 2011/0157772 A1* | 6/2011 | Zhamu | B82Y 30/00 361/502 |
| 2011/0186949 A1* | 8/2011 | Yamazaki | H01L 23/295 257/428 |
| 2011/0204020 A1 | 8/2011 | Johnstone et al. | |
| 2011/0235230 A1* | 9/2011 | Lee | G06F 3/045 361/212 |
| 2012/0208008 A1* | 8/2012 | Tour | B82Y 30/00 428/336 |
| 2012/0270960 A1* | 10/2012 | Felisari | B82Y 30/00 521/90 |
| 2012/0282419 A1* | 11/2012 | Ahn | B82Y 40/00 428/34.8 |
| 2012/0286975 A1* | 11/2012 | Thomson | G08G 5/0021 340/974 |
| 2013/0171452 A1 | 7/2013 | Goela et al. | |
| 2013/0251998 A1* | 9/2013 | Hwang | C23C 16/26 428/408 |
| 2013/0329366 A1* | 12/2013 | Wang | H05K 7/20963 361/704 |
| 2014/0044865 A1* | 2/2014 | Haick | H01B 13/30 427/58 |
| 2014/0212659 A1 | 7/2014 | Dai et al. | |
| 2014/0272199 A1* | 9/2014 | Lin | H01L 51/444 427/600 |

FOREIGN PATENT DOCUMENTS

| | | |
|---|---|---|
| JP | 2008-205273 A | 9/2008 |
| JP | 2012-212706 A | 1/2012 |
| JP | 2013-232389 A | 11/2013 |
| KR | 10-2013-0001705 A | 1/2013 |
| WO | 2009069684 A1 | 6/2009 |

OTHER PUBLICATIONS

"A roadmap for graphene", K. S. Novoselov, V. I. Falko, L. Colombo, P. R. Gellert, M. G. Schwab, K. Kim, Nature, vol. 490, pp. 192-200, Oct. 2012.*
"The application of graphene as electrodes in electrical and optical devices", Gunho Jo, Minhyeok Choe, Sangchul Lee, Woojin Park, Yung Ho Kahng and Takhee Lee, Nanotechnology 23 (2012) 112001 (19pp).*
"Arrays of single-walled carbon nanotubes with full surface coverage for high-performance electronics", Qing Cao, Shu-jen Han, George S. Tulevski, Yu Zhu, Darsen D. Lu and Wilfried Haensch, Nature Nanotechnology, vol. 8, Mar. 2013.*
"Transparent Film Heater Using Single-Walled Carbon Nanotubes", Yeo-Hwan Yoon, Jin-Won Song, Duckjong Kim, Joondong Kim, June-Ki Park, Sang-Keun Oh, and Chang-Soo Han, Adv. Mater. 2007, 19, 4284-4287.*
"Hydrophobic vertically aligned carbon nanotubes on Corning glass for self cleaning applications", Ian Y.Y. Bu, Shu Pei Oei, Applied Surface Science 256 (2010) 6699-6704.*
Balandin et al., "Superior Thermal Conductivity of Single-Layer Graphene," Nano Letters, vol. 8, No. 3, 2008, pp. 902-907.
Bommel et al., "Leed and Auger Electron Observations of the SiC (0001) Surface," Surface Science 48, 1975, pp. 463-472.
Ishigami et al., "Crystal Plane Dependent Growth of Aligned Single-Walled Carbon Nanotubes on Sapphire," J. Am. Chem. Soc. 2008, vol. 130, No. 30, pp. 9918-9924.
Li et al., "Heat Conduction Across Multiwalled Carbon Nanotube/Graphene Hybrid Films," 2011 13th Electronics Packaging Technology Conference, Copyright 2011, IEEE, pp. 63-66.
Peng et al., Direct Growth of Bilayer Graphene on SiO2 Substrates by Carbon Diffusion Through Nickel, ACS Nano 2011, vol. 5, No. 10, pp. 8241-8247.
Ren et al., "Synthesis of Large Arrays of Well-Aligned Carbon Nanotubes on Glass," Science vol. 282, Nov. 1998, pp. 1105-1107.
Vlassiouk et al., "Role of Hydrogen in Chemical Vapor Deposition Growth of Large Single-Crystal Graphene," ACS Nano 2011, vol. 5, No. 7, pp. 6069-6076.
Yan et al., "Growth of Bilayer Graphene on Insulating Substrates," ACS Nano 2011, vol. 5, No. 10, pp. 8187-8192.
Hermanson et al., "Dielectrophoretic Assembly of Electrically Functional Microwires from Nanoparticle Suspensions," Science, vol. 294 (2001), pp. 1082-1086.
Partial International Search Report for PCT/US2015/015630 dated Jun. 5, 2015.
International Search Report and Written Opinion for PCT/US2015/017043 dated Jun. 10, 2015.
Grace, Tom, "An Introduction to Carbon Nanotubes," Center on Polymer Interfaces and Macromolecular Assemblies, Jun. 26, 2003, XP055192255, CPIMA RET Program (retrived from the internet: URL:http://web.stanford.edu/group/cpima/education/nanotube_lesson.pdf [retrived on May 29, 2015]), pp. 6-10.
Sinclair, John, "An Introduction to Carbon Nanotubes," Mar. 24, 2009, XP055192250 (retrieved from the internet: URL:http://sces.phys.utk.edu/~dagotto/condensed/HW1_2009/Carbon_Nanotube_John_Sinclair.pdf (retrieved on May 29, 2015), Figures 1, 2.
Pop, Eric, et al., "Thermal properties of graphene: Fundamentals and applications," MRS Bulletin, vol. 37, No. 12, Nov. 23, 2012, pp. 1273-1281, XP055192279, ISSN: 0883-7694, DOI: 10.1557/mrs.2012.203, Figure 3, p. 6, paragraph 2.
Notice of Reasons for Rejection dated Jan. 29, 2019 (in Japanese and English translation provided), 7 pages.

(56) References Cited

OTHER PUBLICATIONS

Notice of Reasons for Rejection Final Action dated May 21, 2019 (in Japanese and English translation provided), 5 pages.

* cited by examiner

GRAPHENE COATED ELECTRONIC COMPONENTS

FIELD

This disclosure relates to coated electronic components, apparatus comprising coated electronic components, and methods of coating electronic components.

BACKGROUND

Electronic components and electronic connections or connectors are generally sensitive to environmental elements and stimuli. As a result, it is often desirable to coat or cover such components or connections or connectors to increase their service life. However, in many applications, electronic components and/or connections may need to be visible and/or transparent to a specific wavelength of electromagnetic radiation during normal operation. In these situations, conformal coatings are sometimes used. Unfortunately, poor applications of coatings or poor quality coatings can lead to component or connection exposure and subsequent component or connection failure. Extreme changes in temperature, pressure, and/or humidity (such as experienced in some aerospace applications) can also lead to component or connection failure. Additionally, many conformal and non-conformal types of protection for electronic components and connections are heavy and/or bulky, adding excess weight and/or taking up excessive volume. In many applications, such as aerospace applications, additional weight and volume are undesirable. Therefore, there exists a need for improved coatings for electronic components and connections.

SUMMARY

In one aspect, coated electronic components and electronic connectors or connections from, to, or between electronic components (hereinafter referred to collectively as "electronic components") are described herein. Such coated electronic components, in some implementations, may provide one or more advantages over previous coated electronic components. For example, in some implementations, a coated electronic component described herein has decreased volume and/or mass compared to some other coated electronic components. In addition, a coated electronic component described herein can exhibit an improved hardness and/or a reduced thickness of the coating layer compared to some other electronic components. Further, in some implementations, a coated electronic component described herein exhibits improved resistance to environmental elements and stimuli without significantly altering or degrading the visibility of the underlying components. Therefore, in some implementations, a coated electronic component described herein can exhibit improved mechanical and environmental performance without substantial alteration of the component's visibility or optical transparency.

In some implementations, a coated electronic component described herein comprises an electronic component and a graphene coating layer disposed on an environment-facing surface of the electronic component. The graphene coating layer, in some implementations, has an average thickness of about 300 nm or less. In some implementations, a graphene coating layer described herein comprises one or more graphene sheets. In other implementations, a graphene coating layer comprises a layer of graphene tubes. Graphene tubes of a graphene coating layer described herein, in some implementations, can have a horizontal or substantially horizontal orientation. In other implementations, graphene tubes of a graphene coating layer described herein can have a vertical or substantially vertical orientation. In addition, in some implementations, a coated electronic component described herein further comprises an electrically insulating material layer disposed between the electronic component and the graphene coating layer. Moreover, in some implementations, a coated electronic component described herein exhibits one or more of a high water-in-air contact angle and a high hardness and/or bulk modulus.

In another aspect, methods of coating an electronic component are described herein. In some implementations, a method of coating an electronic component described herein comprises disposing a layer of graphene on an environment-facing surface of the electronic component. In some implementations, disposing the graphene layer is carried out using a vapor deposition method. In other cases, the graphene layer is formed by disposing a plurality of graphene platelets on the environment-facing surface and connecting the platelets to one another with one or more micro-wires. In some instances, the graphene layer is formed by disposing the electronic component in a high temperature environment and forming a graphene coating layer by a thermal carburization technique. Moreover, in some cases, a method described herein further comprises disposing a layer of electrically insulating material on the environment-facing surface of the electronic component, wherein the layer of insulating material is positioned between the environment-facing surface and the graphene layer.

In another aspect, methods of increasing the service lifetime of an electronic apparatus disposed within a vehicle or other environment are described herein. The vehicle may be an aerospace vehicle such as an aircraft, helicopter, rocket or satellite. Alternatively, the vehicle may be a non-aerospace vehicle such as a boat, submarine, or automobile. An electronic apparatus may also be disposed within an environment such as a manufacturing environment. In some cases, an electronic apparatus is disposed within the passenger cabin of an aircraft. In some implementations, such a method comprises disposing a graphene coating layer, and optionally an electrically insulating material layer, on an environment-facing surface of an electronic component of the apparatus. In some implementations, the electronic apparatus exhibits at least a 10 percent improvement in environmental testing performance compared to an otherwise equivalent electronic apparatus not comprising a graphene coating layer, the environmental testing performance comprising performance in a waterproofness test, acetic acid test, sugar solution test, or methyl alcohol test described herein. Moreover, in some implementations, the electronic apparatus exhibits at least a 10 percent improvement in two or more of the waterproofness test, acetic acid test, sugar solution test, and methyl alcohol test.

These and other implementations are described in greater detail in the detailed description which follows.

DETAILED DESCRIPTION

Implementations described herein can be understood more readily by reference to the following detailed description, examples, and drawings. Elements, apparatus, and methods described herein, however, are not limited to the specific implementations presented in the detailed description, examples, and drawings. It should be recognized that these implementations are merely illustrative of the principles of the present disclosure. Numerous modifications and adaptations will be readily apparent to those of skill in the art without departing from the spirit and scope of the disclosure.

In addition, all ranges disclosed herein are to be understood to encompass any and all subranges subsumed therein. For example, a stated range of "1.0 to 10.0" should be considered to include any and all subranges beginning with a minimum value of 1.0 or more and ending with a maximum value of 10.0 or less, e.g., 1.0 to 5.3, or 4.7 to 10.0, or 3.6 to 7.9.

All ranges disclosed herein are also to be considered to include the end points of the range, unless expressly stated otherwise. For example, a range of "between 5 and 10" should generally be considered to include the end points 5 and 10.

Further, when the phrase "up to" is used in connection with an amount or quantity, it is to be understood that the amount is at least a detectable amount or quantity. For example, a material present in an amount "up to" a specified amount can be present from a detectable amount and up to and including the specified amount.

I. Coated Electronic Components

In one aspect, coated electronic components are described herein. In some implementations, a coated electronic component comprises an electronic component and a graphene coating layer disposed on an environment-facing surface of the electronic component. In addition, in some cases, a coated electronic component described herein further comprises an electrically insulating material layer disposed between the electronic component and the graphene coating layer. The graphene coating layer, in some implementations, provides improved protection from environmental exposure without significantly increasing the total volume or mass of the electronic component. For example, in some implementations, a coated electronic component described herein exhibits an increased water-in-air contact angle on the environment-facing surface of the electronic component and/or exhibits increased corrosion resistance compared to an uncoated electronic component. Moreover, in some implementations, the coating layer of a coated electronic component described herein has a reduced thickness and/or improved optical transparency compared to some other coatings of electronic components. The electrically insulating material layer of a coated electronic component, in some implementations, can be used to prevent electrical contact between the graphene coating layer and an exposed electrically conductive material on the environment-facing surface of the electronic component.

Turning now to specific components of coated electronic components, a coated electronic component described herein comprises a graphene coating layer disposed on an environment-facing surface of the electronic component. An "environment-facing" surface, for reference purposes herein, can be any surface which is exposed to the external environment of the component. An environment-facing surface can thus be exposed to various conditions and/or stimuli. For example, in some implementations, an environment-facing surface may be exposed to one or more airborne contaminants. An environment-facing surface may also be exposed to liquid spills or other accidents that may occur in the vicinity of the coated electronic component. In some implementations, an environment-facing surface may be exposed to and/or oriented toward a compartment of a vehicle or other environment, such as a compartment of an aerospace vehicle or a non-aerospace vehicle described herein, or a compartment of a manufacturing environment. For example, in some instances, an environment-facing surface may be exposed to and/or oriented towards a passenger compartment and/or cockpit of an airplane cabin. Alternatively, in other cases, an environment-facing surface may be exposed to and/or oriented toward the exterior of a vehicle or other environment. For example, in some instances, a coated electronic component may comprise an electronic sensor affixed to the outside or exterior of a spacecraft, airplane, submarine, automobile, building, or other structure. Thus, a coated electronic component described herein, in some implementations, may be used in space, water, air, a toxic chemical environment, or other environment to protect electronic components such as sensors, radar components, antennas, dish antennas, humidity detectors, audio detectors, nuclear detectors, biosensors, or other electronic sensors, including sensors exposed to external environments.

Any graphene coating layer not inconsistent with the objectives of the present disclosure may be used. For reference purposes herein, a "graphene" coating layer includes $sp^2$-bonded carbon as a primary carbon component, as opposed to $sp^3$-bonded carbon. In some implementations, a graphene coating layer described herein comprises no $sp^3$-hybridized carbon or substantially no $sp^3$-hybridized carbon. For example, in some implementations, a graphene coating layer comprises less than about 10 atom percent or less than about 5 atom percent $sp^3$-hybridized carbon, relative to the total amount of carbon in the coating layer. In some implementations, a graphene coating layer comprises less than about 2 atom percent or less than about 1 atom percent $sp^3$-hybridized carbon. Moreover, a graphene coating layer described herein, in some implementations, does not comprise, consist, or consist essentially of diamond-like carbon (DLC).

In some implementations, a graphene coating layer comprises, consists, or consists essentially of one or more graphene sheets. A graphene sheet, in some implementations, comprises a single molecular or atomic layer having a flat planar structure. Any number of graphene sheets not inconsistent with the objectives of the present disclosure may be used. In some implementations, a graphene coating layer comprises a plurality of graphene sheets. The plurality of graphene sheets, in some implementations, can be arranged in a stacked or layered configuration. In other implementations, a graphene coating layer comprises or consists of a single graphene sheet. Therefore, in some implementations, a graphene coating layer described herein comprises 1 or more atomic layers of graphene. In some implementations, a graphene coating layer comprises between 1 and 10 atomic layers of graphene. In some implementations, a graphene coating layer comprises between 1 and 5 atomic layers or between 1 and 3 atomic layers of graphene. In some implementations, a graphene coating layer comprises 1 atomic layer of graphene.

Figure 1:
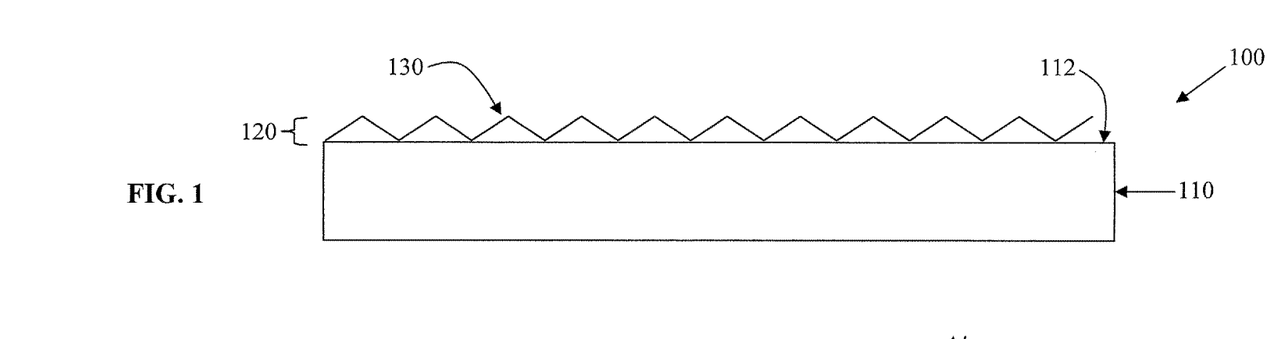
FIG. 1 illustrates a side view of a coated electronic component according to one implementation described herein.

FIG. 1 illustrates a side view of a coated electronic component comprising a graphene coating layer comprising a graphene sheet. As understood by one of ordinary skill in the art, the various elements depicted in FIG. 1 are representational only and are not necessarily drawn to scale. In the implementation of FIG. 1, a coated electronic component (100) comprises an electronic component (110) and a graphene coating layer (120) disposed on a surface (112) of the electronic component (110). Graphene coating layer (120) comprises a graphene sheet (130). Graphene sheet (130) is depicted schematically in FIG. 1 by a line resembling an alkane chain. However, as understood by one of ordinary skill in the art, such a depiction is for illustration purposes only. In addition, electronic component (110) is depicted schematically in FIG. 1 as having a rectangular cross section and a flat planar surface. However, other implementations are also possible. For example, in some implementations, an electronic component can have a circular, elliptical, or other cross sectional shape. Any size and shape not inconsistent with the objectives of the present disclosure may be used. Similarly, in some implementations, the surface (112) of the electronic component (110) can have a curvature, including a convex curvature, a concave curvature, or a periodic or undulating curvature. Further, in some implementations, the surface (112) of the electronic component (110) may have one or more electronic subcomponents disposed thereon, creating a textured or irregular surface. For example, in some cases, one or more transformers, resistors, capacitors and/or inductors are disposed on the surface (112), and the graphene sheet (130) is disposed over the subcomponents. In addition, in some cases, an intermediary insulating material layer (not shown) may be disposed between the surface (112), including one or more electronic subcomponents that may be disposed on the surface (112), and the graphene coating layer (120).

In other implementations, a graphene coating layer described herein comprises, consists, or consists essentially of a layer of graphene tubes. Any graphene tubes not inconsistent with the objectives of the present disclosure may be used. In some implementations, graphene tubes comprise carbon nanotubes (CNTs) such as single-walled carbon nanotubes (SWNTs) or multi-walled carbon nanotubes (MWNTs). Moreover, graphene tubes can have any size not inconsistent with the objectives of the present disclosure. For example, in some implementations, graphene tubes have a size in at least one dimension of less than about 300 nm or less than about 100 nm. In some implementations, graphene tubes have a size in at least one dimension between about 1 nm and about 200 nm, between about 1 nm and about 150 nm, or between about 5 nm and about 100 nm. In some implementations, graphene tubes have a size in at least one dimension between about 5 nm and about 75 nm or between about 15 nm and about 60 nm. In some implementations, graphene tubes have a size in at least one dimension between about 20 nm and about 30 nm or between about 45 nm and about 55 nm. In some implementations, graphene tubes have a size in at least two dimensions of less than about 300 nm or less than about 100 nm. In some implementations, graphene tubes have a size in at least two dimensions between about 1 nm and about 200 nm, between about 1 nm and about 150 nm, or between about 5 nm and about 100 nm. In some implementations, graphene tubes have a size in at least two dimensions between about 5 nm and about 75 nm or between about 15 nm and about 60 nm.

Moreover, in some implementations, graphene tubes of a graphene coating layer have a low aspect ratio. In some implementations, graphene tubes have an aspect ratio of about 20 or less or about 10 or less. In some implementations, graphene tubes have an aspect ratio between about 2 and about 15 or between about 3 and about 10. In addition, graphene tubes having an aspect ratio of about 20 or less, in some implementations, have a length ranging from about 5 nm to about 200 nm or from about 10 nm to about 100 nm.

Further, the graphene tubes of a graphene coating layer described herein, in some implementations, can be oriented in the layer. In some implementations, one or more graphene tubes can be oriented horizontally or substantially horizontally in the layer. In other implementations, one or more graphene tubes can be oriented vertically or substantially vertically in the layer. Moreover, in some implementations, vertically or substantially vertically oriented graphene tubes in a layer are aligned or substantially aligned with one another, including in an array.

Figures 2, 3:
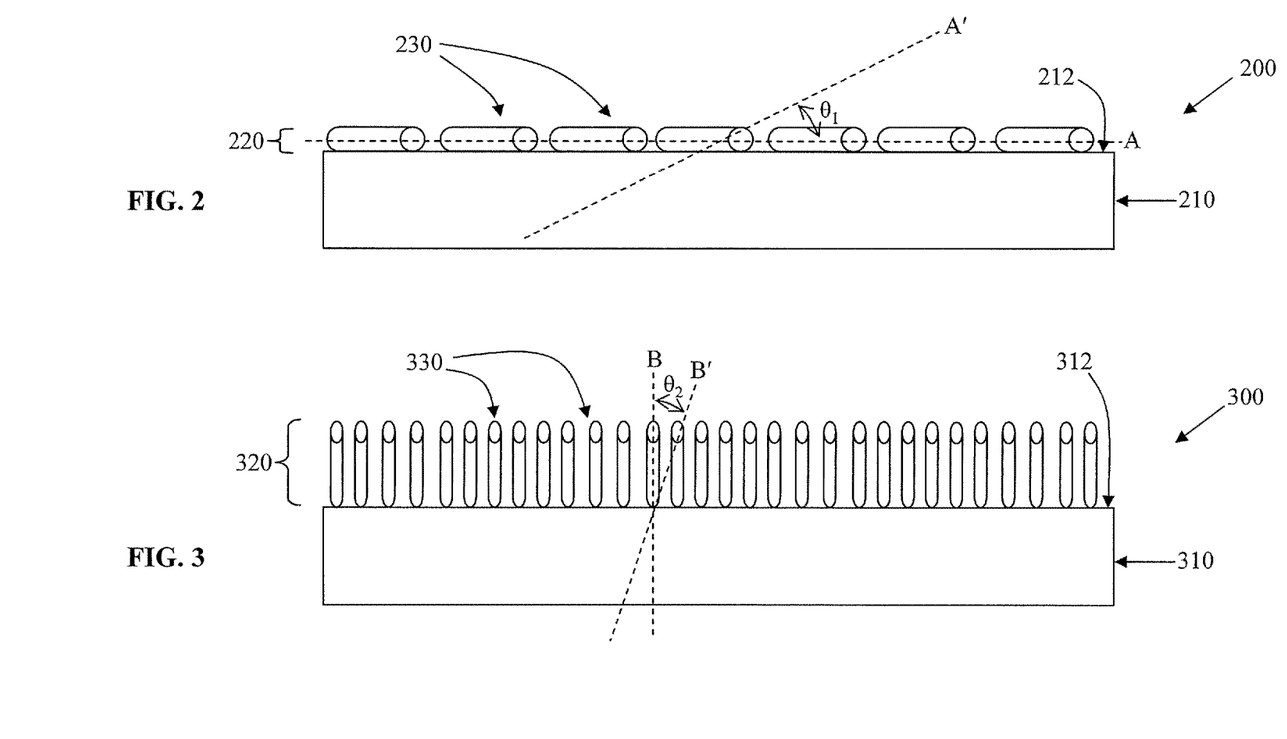
FIG. 2 illustrates a side view of a coated electronic component according to one implementation described herein.
FIG. 3 illustrates a side view of a coated electronic component according to one implementation described herein.

FIGS. 2 and 3 each illustrate a graphene coating layer comprising a layer of graphene tubes according to some implementations described herein. With reference to FIG. 2, a coated electronic component (200) comprises an electronic component (210) and a graphene coating layer (220) disposed on a surface (212) of the electronic component (210). Further, in some cases, an intermediary electrically insulating layer (not shown) can be positioned between the surface (212) and the graphene coating layer (220). In the implementation of FIG. 2, the graphene coating layer (220) of coated electronic component (200) comprises a plurality of graphene tubes (230) oriented horizontally or substantially horizontally on the surface (212) of the electronic component (210). Horizontal orientation is relative to the surface (212). For reference purposes herein, a "horizontal" orientation comprises an orientation wherein the long axis of a graphene tube (230) is oriented parallel to the surface (212). In the implementation of FIG. 2, all of the graphene tubes (230) are depicted as having a long axis oriented parallel to the surface (212). However, other arrangements are possible. For example, in some implementations, one or more graphene tubes can have a long axis along line A' in FIG. 2 or along some other direction that is not parallel to the surface (212). For reference purposes herein, a "substantially horizontal" orientation comprises an orientation wherein the long axis (A') of a graphene tube forms an angle ($\theta_1$) of less than about 45 degrees with a line (A) parallel to the surface (212) of the electronic component (210). In some implementations, the angle ($\theta_1$) is less than about 30 degrees or less than about 15 degrees. In some implementations, the angle ($\theta_1$) is between about 0 degrees and about 30 degrees. In some implementations, a majority of the graphene tubes of a graphene coating layer described herein have a horizontal or substantially horizontal orientation. Further, in some implementations, at least about 60 percent, at least about 70 percent, at least about 80 percent, or at least about 90 percent of the graphene tubes of a graphene coating layer have a horizontal or substantially horizontal orientation.

In other implementations, the graphene tubes of a graphene coating layer can be oriented vertically or substantially vertically. For example, with reference to FIG. 3, a coated electronic component (300) comprises an electronic component (310) and a graphene coating layer (320) disposed on a surface (312) of the electronic component (310). Further, in some cases, an intermediary insulating layer (not shown) can be positioned between the surface (312) and the graphene coating layer (320). In the implementation of FIG. 3, the graphene coating layer (320) of coated electronic component (300) comprises a plurality of graphene tubes (330) oriented vertically or substantially vertically on the surface (312) of the electronic component (310). Vertical orientation is relative to the surface (312). For reference purposes herein, a "vertical orientation" comprises an orientation wherein the long axis of a graphene tube (330) is oriented perpendicular to the surface (312). In the implementation of FIG. 3, all of the graphene tubes (330) are depicted as having a long axis oriented perpendicular to the surface (312). However, other arrangements are possible. For example, in some implementations, one or more graphene tubes can have a long axis along line B' in FIG. 3 or along some other direction that is not parallel to the surface (312). A "substantially vertical" orientation, for reference purposes herein, comprises an orientation wherein the long axis (B') of a graphene tube forms an angle ($\theta_2$) of less than about 45 degrees with a line (B) perpendicular to the surface of the electronic component. In some implementations, the angle ($\theta_2$) is less than about 30 degrees or less than about 15 degrees. In some implementations, the angle ($\theta_2$) is between about 0 degrees and about 30 degrees. In some implementations, a majority of the graphene tubes of a graphene coating layer described herein have a vertical or substantially vertical orientation. Further, in some implementations described herein, at least about 60 percent, at least about 70 percent, at least about 80 percent, or at least about 90 percent of the graphene tubes of a graphene coating layer have a vertical or substantially vertical orientation.

In addition, in some implementations, a graphene coating layer described herein comprises, consists, or consists essentially of a monolayer of graphene tubes, including a monolayer of horizontally or substantially horizontally oriented graphene tubes or a monolayer of vertically or substantially vertically oriented graphene tubes.

Moreover, a graphene coating layer described herein can have any thickness not inconsistent with the objectives of the present disclosure. In some implementations, for example, a graphene coating layer has an average thickness of about 300 nm or less or about 200 nm or less. In some implementations, a graphene coating layer has an average thickness of about 100 nm or less. In some implementations, a graphene coating layer has an average thickness of about 50 nm or less, about 10 nm or less, or about 5 nm or less. In some implementations, a graphene coating layer has an average thickness of about 3 nm or less, about 2 nm or less, or about 1 nm or less. For example, in some implementations, a graphene coating layer described herein may have an average thickness between about 1 nm and about 300 nm, between about 1 nm and about 200 nm, between about 1 nm and about 100 nm, between about 10 nm and about 300 nm, between about 10 nm and about 200 nm, or between about 10 nm and about 100 nm. Further, in some implementations, a graphene coating layer may have an average thickness between about 50 nm and about 300 nm, between about 50 nm and about 200 nm, between about 50 nm and about 100 nm, or between about 100 nm and about 300 nm. In some implementations, a graphene coating layer may have an average thickness greater than about 100 nm or greater than about 300 nm.

Further, in some implementations wherein a graphene coating layer described herein comprises a layer of graphene tubes, the average thickness of the coating layer is no greater than about 50 times the average diameter of the graphene tubes. In some implementations, the average thickness of the coating layer is no greater than about 20 times or no greater than about 10 times the average diameter of the graphene tubes. In some implementations, the average thickness of the coating layer is no greater than about 5 times, no greater than about 3 times, or no greater than about 2 times the average diameter of the graphene tubes. In other implementations, the average thickness of the coating layer is no greater than about 3 times the average length of the graphene tubes. In some implementations, the average thickness of the coating layer is no greater than about 2 times, no greater than about 1.5 times, or no greater than about 1 times the average length of the graphene tubes.

In some implementations, a graphene coating layer described herein comprises or is formed from a plurality of graphene platelets connected by micro-wires. In some implementations, a plurality of graphene platelets can be disposed on an environment-facing surface of the electronic component, and the plurality of graphene platelets can be connected by one or more micro-wires. In some implementations, graphene platelets can be pre-fabricated separately from the electronic component and subsequently disposed upon an environment-facing surface of an electronic component for subsequent connection by micro-wires. In addition, graphene platelets can have any size or shape not inconsistent with the objectives of the present invention. For example, in some cases, the graphene platelets have a width or diameter of about 1 µm to about 2000 µm. In some implementations, graphene platelets have a width or diameter of between about 50 µm and about 1800 µm, between about 200 µm and about 1500 µm, or between about 400 µm and about 1200 µm. Further, in some implementations, graphene platelets have a width or diameter of between about 1 µm and about 1500 µm, between about 500 µm and about 1300 µm, between about 1000 µm and about 2000 µm, or between about 50 µm and about 1000 µm.

Additionally, micro-wires of a graphene coating layer described herein can be formed from any material not inconsistent with the objectives of the present disclosure. For example, in some implementations, micro-wires are formed from metallic nanoparticles such as gold nanoparticles, polymer microspheres, and/or combinations thereof. In some implementations, micro-wires can be formed from mixed suspensions of gold and sub-micron sized polystyrene latex microspheres. Further, micro-wires can have any size or shape not inconsistent with the objectives of the present disclosure. For example, in some implementations, micro-wires have a diameter between about 1 nm and about 100 nm, between about 10 nm and about 40 nm, or between about 15 nm and about 50 nm. In some implementations, micro-wires have diameters between about 1 nm and about 30 nm, between about 15 nm and about 30 nm, or between about 15 nm and about 100 nm. Further, in some implementations, micro-wires have a length between about 15 nm and 5 cm, between about 100 nm and about 5 cm, between about 500 nm and about 5 cm, between about 1 µm and about 5 cm, or between about 1 mm and about 5 cm. In some implementations, micro-wires have a length between about 15 nm and about 1 cm, between about 500 nm and about 1 cm, between about 1 cm and about 5 cm, between about 1 µm and about 1 cm, between about 1 mm and about 1 cm, or between about 5 mm and about 3 cm. Formation, deposition, and/or placement of micro-wires can be carried out in any manner not inconsistent with the objectives of the present disclosure. In some implementations, for instance, micro-wires may be formed by a dielectrophoretic assembly process, as described further hereinbelow.

In addition, the graphene coating layer of a coated electronic component described herein is disposed on a surface of an electronic component. In some implementations, the graphene coating layer is disposed directly on the surface of the electronic component. Moreover, in some implementations, the graphene coating layer is bonded or adhered to the surface of the electronic component. The bonding, in some implementations, comprises chemical bonding. In some implementations, bonding comprises physical bonding. Bonding, in some implementations, comprises or consists of one or more of covalent bonding, ionic bonding, hydrogen bonding, electrostatic interactions, and van der Waals interactions. In some implementations, for instance, bonding comprises or consists of van der Waals interactions. In some implementations, a graphene coating layer described herein is bonded or adhered to a surface of an electronic component with an adhesion energy of at least about 75 mJ/m$^2$ or at least about 100 mJ/m$^2$, when measured by scanning electron microscopy (SEM) according to the method of Zong et al., "Direct measurement of graphene adhesion on silicon surface by intercalation of nanoparticles," *J. Appl. Phys.*, volume 107, page 026104-1 to 026104-3 (2007). Specifically, the adhesion energy ($\gamma$) is given by equation (1):

$$\gamma = \lambda E h (w/a)^4 \quad (1),$$

where $\lambda$ is a geometrical factor equal to $1/16$, E is 0.5 TPa, h is the thickness of the graphene coating layer, w is a central blister displacement equal to the diameter of an intercalated nanoparticle, and a is a blister radius measured by SEM. The blister is provided by disposing a so-called wedge particle or intercalated nanoparticle between the coating layer and the substrate, as taught by Zong et al. The wedge particle can comprise any suitable particle not inconsistent with the objectives of the present disclosure. In some implementations, for instance, the wedge particle comprises a gold or silver nanoparticle having a diameter between about 10 nm and about 100 nm, the wedge particle being disposed between the electronic component and the coating layer for measurement purposes. In some implementations, a graphene coating layer is bonded or adhered to a surface of an electronic component with an adhesion energy of at least about 150 mJ/m$^2$ when measured as described herein. In some implementations, a graphene coating layer is bonded or adhered to a surface of an electronic component with an adhesion energy between about 50 mJ/m$^2$ and about 300 mJ/m$^2$ or between about 100 mJ/m$^2$ and about 200 mJ/m$^2$. In some implementations, a graphene coating layer described herein resists delamination or other detachment from the electronic component over time, including when exposed to adverse environmental conditions, such as extreme temperatures, high humidity, dust, or electromagnetic radiation exposure, or when exposed to variations or cycles of exposure to such conditions. Further, in some implementations, a graphene coating layer described herein is continuous or substantially continuous across the entire surface of the electronic component.

Any electronic component not inconsistent with the objectives of the present disclosure can be used. In some implementations, an electronic component comprises an integrated circuit, transformer, resistor, capacitor, inductor, or an electrical connection to, from, or between electronic components. In some implementations, an electronic component comprises a circuit board such as a printed circuit board, which may include one or more electronic connections or connectors. Moreover, an electronic component can comprise or be formed from any material not inconsistent with the objectives of the present disclosure. For example, in some implementations, an electronic component comprises or is formed from a laminate such as a copper-clad laminate, a resin impregnated B-stage cloth, an epoxy, a liquid photoimageable solder mask ink, and/or a dry film photoimageable solder mask. In some implementations, an electronic component comprises or is formed from a semiconductor material such as Si, Ge, or InP; a metal such as stainless steel, gold, silver, or cooper; and/or a dielectric material such as sapphire, $SiO_2$, and SiC. Other materials may also be used.

A coated electronic component described herein, in some cases, further comprises an electrically insulating material layer disposed between the graphene coating layer and the environment-facing surface of the electronic component. Any insulating material layer not inconsistent with the objectives of the present disclosure may be used. In some cases, for instance, an insulating material layer comprises or is formed from a polymeric material such as a plastic or rubber material. In other cases, an insulating material layer comprises or is formed from bi-layer graphene (BLG) or graphene oxide. In some implementations, an insulating material layer comprises or is formed from an inorganic material such as silicon dioxide or a ceramic. Other electrically insulating materials may also be used.

Moreover, an insulating material layer described herein can have any thickness not inconsistent with the objectives of the present disclosure. In some implementations, for example, an insulating material layer has an average thickness of about 10 µm or less or about 1 µm or less. In some implementations, an insulating material layer has an average thickness of about 500 nm or less. In some implementations, an insulating material layer has an average thickness between about 100 nm and about 10 µm, between about 500 nm and about 10 µm, or between about 100 nm and about 1 µm. In some implementations, an electrically insulating material layer may have an average thickness greater than about 10 µm.

Further, a coated electronic component described herein, in some implementations, can exhibit one or more desired properties. In some implementations, for instance, a graphene coating layer of a coated electronic component described herein exhibits a high optical transparency, including in the visible region of the electromagnetic spectrum. For reference purposes herein, optical transparency is relative to the total amount of incident radiation in a given wavelength range. Optical transparency can be measured with a broad spectral source or a narrow spectral source. Moreover, optical transparency of a coating can be measured in any manner not inconsistent with the objectives of the present disclosure, including with any suitable instrumentation. For example, in some implementations, optical transparency is measured with a spectrometer such as a BECKMAN spectrometer.

In some implementations, a graphene coating layer of a coated electronic component described herein exhibits an optical transparency of at least about 60 percent or at least about 70 percent between about 350 nm and about 750 nm. In some implementations a graphene coating layer of a coated electronic component exhibits a transparency of at least about 85 percent between about 350 nm and about 750 nm. In some implementations, a graphene coating layer of a coated electronic component exhibits a transparency of at least about 90 percent or at least about 95 percent between about 350 nm and about 750 nm. In some implementations, a graphene coating layer of a coated electronic component exhibits an optical transparency of between about 60 percent and about 99.99 percent or between about 70 percent and about 95 percent at wavelengths between about 350 nm and about 750 nm. Moreover, in some implementations, a graphene coating layer of a coated electronic component described herein exhibits an optical transparency of about 60 percent to about 99.99 percent or about 75 percent to about 95 percent at wavelengths between about 200 nm and about 800 nm or between about 220 nm and about 350 nm.

In some implementations, a coated electronic component described herein exhibits high water resistance. For example, in some cases, a coated electronic component exhibits a water-in-air contact angle of at least about 95 degrees, at least about 100 degrees, or at least about 110 degrees on the environment-facing surface of the coated electronic component. In some implementations, a coated electronic component exhibits a water-in-air contact angle of between about 95 degrees and about 130 degrees, between about 95 degrees and about 125 degrees, between about 95 degrees and about 110 degrees, between about 95 degrees and about 105 degrees, or between about 95 degrees and about 100 degrees. In some implementations, a coated electronic component displays a water-in-air contact angle of between about 100 degrees and 125 degrees. The water-in-air contact angle of a coated electronic component described herein can be measured in any manner not inconsistent with the objectives of the present disclosure. For example, in some implementations, the water-in-air contact angle is measured by a static sessile drop method or a dynamic sessile drop method using a contact angle goniometer.

Moreover, in some implementations, a coated electronic component described herein exhibits a high mechanical hardness, stiffness, or resistance to compression. In some implementations, for instance, a graphene coating layer of a coated electronic component described herein exhibits a tensile modulus of up to about 2 TPa or up to about 1 TPa, when measured by nanoindentation in an atomic force microscope (AFM) according to the method described in Lee et al., "Measurement of the Elastic Properties and Intrinsic Strength of Monolayer Graphene," *Science*, volume 321, number 5887, pages 385-388 (18 Jul. 2008). Specifically, the tensile modulus is determined by fitting to equation (2):

$$F = \sigma_0(\pi a)(\delta/a) + E(q^3 a)(\delta/a)^3 \quad (2),$$

where F is applied force, $\sigma_0$ is the pretension in the coating layer, a is the membrane diameter, $\delta$ is the deflection at the center point, E is the tensile modulus, and q is a dimensionless constant equal to 1.02. For measurement purposes, a graphene coating layer is disposed on an electronic component having a plurality of circular wells (diameter of about 1 μm to 1.5 μm, depth of about 500 nm). The coating layer deposited over the wells can form a series of free-standing membranes. Mechanical properties are measured by indenting the center of each free-standing membrane with an AFM, as taught by Lee et al. In some implementations, a coated electronic component exhibits a tensile modulus of up to about 500 GPa or up to about 100 GPa when measured by nanoindentation as described herein. In some implementations, a coated electronic component exhibits a tensile modulus of up to about 50 GPa or up to about 30 GPa. In some implementations, a coated electronic component described herein exhibits a tensile modulus of between about 1 GPa and about 1 TPa or between about 500 GPa and about 1 TPa, when measured by nanoindentation in an atomic force microscope, such as described above. In some implementations, a coated electronic component exhibits a tensile modulus of between about 10 GPa and about 30 GPa.

Further, in some implementations, a coated electronic component described herein can exhibit a combination of properties described herein. A coated electronic component described herein can exhibit any combination of properties and features not inconsistent with the objectives of the present disclosure. For example, in some implementations, a coated electronic component has one or more the following features:

(1) a coating having an optical transparency between about 60 percent and about 99.99 percent at wavelengths between about 200 nm and about 800 nm, (2) a hardness between about 1 GPa and about 1 TPa or between about 500 GPa and about 1 TPa, when measured by nanoindentation, as described above, (3) a water-in-air contact angle between about 95 degrees and about 130 degrees when measured as described above, (4) an adhesion energy of at least about 75 mJ/m$^2$ or at least about 100 mJ/m$^2$, when measured as described above, and (5) a graphene coating layer having a thickness of less than about 100 nm or less than about 10 nm.

II. Methods of Coating an Electronic Component

In yet another aspect, methods of coating an electronic component are described herein. In some implementations, a method of coating an electronic component comprises disposing a layer of graphene on a surface of an electronic component to provide a graphene coating layer. Moreover, in some cases, a method described herein further comprises disposing a layer of electrically insulating material on the environment-facing surface of the electronic component, wherein the layer of insulating material is positioned between the environment-facing surface and the graphene coating layer.

Turning now to specific steps of methods, methods of coating an electronic component comprises disposing a layer of graphene on a surface of an electronic component to provide a graphene coating layer. The graphene layer can be disposed on the surface of the electronic component in any manner not inconsistent with the objectives of the present disclosure. In some implementations, for example, disposing a graphene layer is carried out using vapor deposition. Vapor deposition, in some implementations, comprises chemical vapor deposition (CVD). For example, in some implementations, CVD can be used to provide a graphene coating layer comprising one or more graphene sheets. Any CVD method not inconsistent with the objectives of the present disclosure may be used. For example, in some implementations, one or more of atmospheric pressure CVD, ultrahigh vacuum CVD, or hot filament (or hot wire or catalytic) CVD can be used. In some implementations, a CVD method comprises disposing a graphene layer from one or more carbon-containing gas-phase reactants. In some implementations, a gas-phase reactant comprises a hydrocarbon. In some implementations, a gas-phase reactant comprises benzene, ethane, methane, or a combination or mixture thereof. Further, in some implementations, a gas-phase reactant is provided in a carrier gas such as H$_2$.

In other implementations, disposing a graphene layer is carried out using catalytic vapor phase deposition. For instance, in some implementations, catalytic vapor deposition can be used to provide a graphene coating layer comprising a layer of graphene tubes having a vertical or substantially vertical orientation described herein. Any catalytic vapor phase deposition method not inconsistent with the objectives of the present disclosure may be used. In some implementations, a catalytic vapor phase deposition method comprises disposing metal catalyst particles on a surface of an electronic component. The metal catalyst particles, in some implementations, can be disposed on the electronic component in an array, such as an ordered array of equally spaced particles. Further, the metal catalyst particles can have any size and chemical composition not inconsistent with the objectives of the present disclosure. Moreover, the size of the metal catalyst particles, in some implementations, is selected to obtain a desired graphene tube diameter. In some implementations, for example, the metal catalyst particles have an average diameter ranging from about 1 nm to about 20 nm or about 1 nm to about 10 nm. In some implementations, the metal catalyst particles have an average diameter of less than about 1 nm. Further, in some implementations, the metal catalyst particles comprise one or more transition metals, including pure metals, metal alloys, or mixtures of metals. In some implementations, the metal catalyst particles comprise nickel particles. In other implementations, the metal catalyst particles comprise a noble metal such as gold or silver.

In addition, in some implementations, a catalytic vapor phase deposition method described herein further comprises disposing the electronic component in a vacuum chamber and heating the electronic component. An electronic component comprising a layer of metal catalyst particles can be heated in the vacuum chamber to any temperature not inconsistent with the objectives of the present disclosure. In some implementations, the electronic component is heated to a temperature between about 600° C. and about 800° C. In some implementations, the electronic component is heated to a temperature of about 700° C.

In some implementations, a catalytic vapor phase deposition method further comprises introducing one or more gases into the vacuum chamber, wherein at least one gas comprises a carbon-containing species. In some implementations, a carbon-containing gas such as acetylene or ethylene is introduced with a process gas such as ammonia or nitrogen. In this manner, in some implementations, a layer of graphene tubes can be grown on the metal catalyst particles disposed on the electronic component.

Further, in some implementations, a graphene layer is formed by disposing a plurality of graphene platelets on the environment-facing surface and connecting the platelets to one another with one or more micro-wires. The plurality of graphene platelets can be formed by any graphene formation technique not inconsistent with connection by micro-wiring techniques. For example, in some implementations, graphene platelets are comprised of pre-fabricated graphene sheets. Further, connection of the graphene platelets by micro-wires can be performed by any micro-wiring technique not inconsistent with the objectives of the present disclosure.

In some implementations, connecting the plurality of graphene platelets is carried out by a dielectrophoretic method. For example, an electronic component with graphene platelets disposed on an environment-facing surface can be subjected to dielectrophoresis with a distance between electrodes varying in any manner not inconsistent with the objectives of the present disclosure. In some implementations, for instance, the distance between electrodes can vary from about 1 µm to more than about 1 cm, depending on the desired length of microwiring. Nanoparticles formed from a material selected for specific properties such as conductivity can then be introduced into a chamber above the electrodes. In some implementations, the nanoparticles can comprise gold nanoparticles having a diameter between about 15 nm and about 30 nm. Alternating voltage can then be applied to the dielectrophoretic chamber. In some implementations, alternating voltage of about 50 V to about 250 V with a frequency of about 50 Hz to about 200 Hz can be applied to the electrodes. Applying alternating voltage can result in the formation of thin, metallic fibers. Regions of carbon-containing bodies, such as graphene platelets, can form islands on an otherwise homogeneous substrate, causing micro-wire growth in the direction of the platelets and connecting the platelets to both electrodes. In some implementations, micro-wires may be formed by a dielectrophoretic assembly process described in Hermanson et al. "Dielectrophoretic Assembly of Electrically Functional Microwires from Nanoparticle Suspensions," *Science*, vol. 294 (5544), pages 1082-1086 (2001).

In other implementations, disposing a graphene layer is carried out using thermal carburization. Any thermal carburization method not inconsistent with the objectives of the present disclosure can be used. In some implementations, a thermal carburization method comprises heating a carbon-containing substrate or electronic component described herein, such as a SiC or carbon steel substrate or component, to a high temperature under ultrahigh vacuum or inert atmosphere. Further, in some cases, a thermal carburization method comprises heating a substrate or electronic component described herein to a high temperature in a carbon-containing atmosphere. A high temperature, in some instances, comprises a temperature greater than about 1000° C. In some implementations, a high temperature can be greater than about 800° C. or greater than about 900° C. Not intending to be bound by theory, it is believed that non-carbon substrate atoms can desorb from the surface during a thermal carburization method described herein, leaving behind a carbon-rich surface. In some implementations, thermal carburization can be carried out in a manner consistent with the methods set forth in Van Bommel et al. "LEED and Auger electron observations of the SiC (0001) surface," *Surface Science*, 48(2), pages 463-472 (1975); or Gullapalli et al. "Graphene Growth via Carburization of Stainless Steel and Application in Energy Storage," *Small*, 12, pages 1697-1700 (2011).

For example, in some implementations, disposing a graphene layer can comprise disposing electronic subcomponents on a carbon-containing substrate, followed by annealing the substrate at a temperature greater than about 1000° C. With increased temperature and time, non-carbon atoms in the substrate can desorb, leaving a carbon-rich coating over the substrate and electronic subcomponents. In some implementations, the carbon-rich coating is a graphene layer disposed on the electronic component. Further, in some implementations, disposing a graphene layer can comprise disposing electronic subcomponents on a non-carbon containing substrate. The substrate and electronic subcomponents can then be disposed in a high temperature environment containing a carbon rich atmosphere. In some implementations, the high temperature can be about 950° C. Further, in some implementations, the carbon rich atmosphere can comprise hexane or another hydrocarbon. In such implementations, a graphene coating layer can be formed over the electronic subcomponents and substrate.

In other implementations, disposing a graphene layer is carried out using direct laser writing or laser scribing on a thin film of graphite oxide (GO) disposed onto the electronic component. Any direct laser writing or scribing method not inconsistent with the objectives of the present disclosure can be used. In some implementations, a direct laser writing or scribing method comprises the direct laser irradiation of a graphite oxide (GO) film under ambient conditions for reducing and patterning graphene films in a solid state. Further, varying the laser intensity and laser irradiation treatments can tune the electrical properties of the resulting laser scribed graphene (LSG). Moreover, by varying the laser intensity, laser frequency, laser pulsing profile, pulsing frequency, pulsing duty cycle, and/or the thickness of the graphite oxide (GO) film, a desired thickness of a graphene coating layer can be obtained. In some implementations, direct laser writing can be carried out in a manner consistent with the methods set forth in El-Kady & Kaner, "Scalable fabrication of high-power graphene micro-supercapacitors for flexible and on-chip energy storage," *Nature Communications*, 4, article number 1475, (Feb. 12, 2013); or Strong et al., "Patterning and Electronic Tuning of Laser Scribed Graphene for Flexible All-Carbon Devices," *ACS Nano*, 6(2), 1395-1403 (2012).

A graphene coating layer provided by a method described herein can have any property of a graphene coating layer described hereinabove in Section I. For instance, in some implementations, a graphene coating layer produced by a method described herein has a thickness of about 100 nm or less. Moreover, the thickness of a graphene coating layer described herein, in some implementations, can be selected by varying one or more parameters during deposition of the coating layer on an electronic component. For example, in some implementations, the thickness of the coating layer is selected by varying the deposition time, where a shorter deposition time provides a thinner coating layer. Further, a deposition time, in some implementations, can be selected using information obtained from a microbalance (such as a quartz crystal microbalance) arranged to determine the mass of material deposited on an electronic component. In some implementations, the information is obtained in real-time by providing information regarding the output of the microbalance (e.g., a measured mass change of an electronic component) to the deposition apparatus such as a chemical vapor deposition system, thereby forming a feedback loop.

In addition, in some implementations, a method of coating an electronic component described herein further comprises removing a portion of the graphene coating layer. In some implementations, removal of a portion of the graphene coating layer may result in a smoother or more uniform environment-facing surface of the graphene coating layer. A portion of a graphene coating layer can be removed in any manner not inconsistent with the objectives of the present disclosure. In some implementations, the removal of a portion of the graphene coating layer comprises applying a carbon remover to the graphene coating layer to remove some but not all of the carbon of the graphene coating layer. In some implementations, a carbon remover is rubbed, pressed, blotted, or daubed on or across a graphene coating layer. Moreover, a carbon remover can comprise any apparatus not inconsistent with the objectives of the present disclosure. In some implementations, a carbon remover comprises one or more planar surfaces which provide friction, abrasion, and/or adhesion to a graphene coating layer.

In some implementations, a carbon remover comprises one or more curved surfaces in addition to or instead of one or more planar surfaces. For instance, in some implementations, applying a carbon remover to a graphene coating layer comprises rolling an adhesive roller over the graphene coating layer. Thus, in some implementations, applying a carbon remover to a graphene coating layer comprises rolling an adhesive roller over the graphene coating layer to remove some but not all of the carbon of the graphene coating layer. Any adhesive roller not inconsistent with the objectives of the present disclosure can be used. In some implementations, an adhesive roller comprises an adhesive material disposed on a rolling surface of the adhesive roller. Moreover, in some implementations, a carbon remover such as an adhesive roller described herein is coupled to a handle, holder, or other apparatus, wherein the carbon remover is configured to roll or otherwise move when the handle is moved in a direction tangential to a surface of the carbon remover, such as a rolling surface of an adhesive roller. In addition, the adhesive material of an adhesive roller or other carbon remover described herein can comprise any adhesive material not inconsistent with the objectives of the present disclosure. For example, an adhesive material can be a fluid material or a solid material. In some implementations, an adhesive material comprises an animal protein-based adhesive material such as a collagen glue, albumin glue, casein glue, or meat glue. In some implementations, an adhesive material comprises bone glue, fish glue, hide glue, hoof glue, or rabbit skin glue. An adhesive material can also comprise a plant-based adhesive material such as a resin or starch. In some implementations, an adhesive material comprises a Canada balsam resin, coccoina, gum arabic resin, latex, methyl cellulose, mucilage, resorcinol resin, or urea-formaldehyde resin or a combination thereof. An adhesive material can also comprise a synthetic adhesive material such as a synthetic monomer glue or a synthetic polymer glue. In some implementations, an adhesive material comprises an acrylonitrile, a cyanoacrylate, or an acrylic glue or a combination thereof. In some implementations, an adhesive material comprises an epoxy resin, an epoxy putty, an ethylene-vinyl acetate, a phenol formaldehyde resin, a polyamide, a polyester resin, a polyethylene hot-melt glue, a polypropylene glue, a polysulfide, a polyurethane, a polyvinyl acetate, a polyvinyl alcohol, a polyvinyl chloride, a polyvinylpyrrolidone, a rubber cement, a silicone, or a styrene acrylate copolymer, or a combination or mixture thereof. In some implementations, an adhesive material comprises a solvent-based adhesive. In some implementations, an adhesive material comprises a paint or a primer. In addition, in some implementations, an adhesive material described herein has an adhesion strength to carbon or a graphene coating layer that exceeds the inter-sheet bonding energy of graphene.

Moreover, in some cases, a method described herein further comprises disposing a layer of electrically insulating material on the environment-facing surface of the electronic component, wherein the layer of insulating material is positioned between the environment-facing surface and the graphene coating layer. The layer of electrically insulating material can be disposed on the environment-facing surface of the electronic component in any manner not inconsistent with the objectives of the present disclosure. In some cases, for instance, an electrically insulating layer is formed by dip coating or spray coating. Further, an insulating material layer provided by a method described herein can have any property of an insulating material layer described hereinabove in Section I.

III. Methods of Increasing the Service Lifetime of an Electronic Apparatus

In yet another aspect, methods of increasing the service lifetime of an electronic apparatus disposed within or on the outside (or exterior) of a vehicle or other environment are described herein. The vehicle may be an aerospace vehicle such as an aircraft, helicopter, rocket or satellite. Alternatively, the vehicle may be a non-aerospace vehicle such as a boat, submarine, or automobile. An electronic apparatus may also be disposed within an environment such as a manufacturing environment. In some cases, an electronic apparatus is disposed within or on the outside of the passenger cabin of an aircraft are described herein. In some implementations, a method of increasing the service lifetime of an electronic apparatus comprises disposing a graphene coating layer, and optionally an electrically insulating material layer, on an environment-facing surface of an electronic component of the apparatus. In some implementations, the electronic apparatus may exhibit at least a 10 percent improvement in environmental testing performance compared to an otherwise equivalent graphene coating layer-free electronic apparatus (i.e., an otherwise equivalent electronic apparatus not comprising a graphene coating layer). The environmental testing performance comprises performance in a waterproofness test, acetic acid test, sugar solution test, or methyl alcohol test described herein. In some implementations, the electronic apparatus can exhibit an improvement in environmental testing performance of at least about 20 percent, at least about 50 percent, at least about 75 percent, at least about 100 percent, or at least about 200 percent in one or more of a waterproofness test, acetic acid test, sugar solution test, or methyl alcohol test described herein. In some cases, an electronic apparatus exhibits an improvement between about 10 percent and about 200 percent, between about 20 percent and about 150 percent, between about 30 percent and about 100 percent, between about 50 percent and about 200 percent, or between about 100 percent and about 200 percent. Moreover, in some implementations, an electronic apparatus may exhibit a percent improvement recited herein in two or more of the waterproofness test, acetic acid test, sugar solution test, and methyl alcohol test.

The environmental testing performance of an electronic apparatus can be measured as set forth in Environmental Conditions and Test Procedures for Airborne Equipment, Document DO-160 issued by RTCA, Inc., the entirety of which is hereby incorporated by reference.

Some implementations described herein are further illustrated in the following non-limiting examples.

Example 1

Graphene Coated Electronic Component

A graphene coated electronic component is prepared as follows. A graphene coating layer comprising a flat planar graphene sheet is applied to a surface of a cleaned electronic component by disposing the electronic component in a CVD chamber and exposing the electronic component to CVD deposition conditions. Optionally, the electronic component may also have an electrically insulating layer disposed on its surface prior to deposition of the graphene coating layer. Specifically, the deposition of the graphene coating layer is carried out at 500° C. for approximately 100 minutes in an atmosphere of 100 Torr partial pressure benzene, ethane or methane and 1 Torr partial pressure $H_2$, at a total pressure of approximately 101 Torr. The thickness of the resulting graphene coating layer is approximately 100 nm. As described hereinabove, a thinner graphene coating layer can be obtained by reducing the deposition time. Further, the deposition time can be selected using information obtained from a microbalance disposed in the chamber and arranged to determine the mass of material deposited on the electronic component as described hereinabove.

Example 2

Graphene Coated Electronic Component

A graphene coated electronic component is prepared as follows. A graphene coating layer comprising vertically or substantially vertically oriented single-walled carbon nanotubes (SWNTs) is applied to a surface of a cleaned electronic component by disposing the electronic component in a CVD chamber and exposing the electronic component to catalytic vapor deposition conditions. Optionally, the electronic component may also have an electrically insulating layer disposed on its surface prior to deposition of the graphene coating layer. Specifically, the deposition of the graphene coating layer is carried out at an electronic component temperature of about 700° C. for approximately 100 minutes in an atmosphere of 100 Torr partial pressure acetylene or ethylene and 5 Torr partial pressure $N_2$ or $NH_3$, at a total pressure of approximately 105 Torr. An array of nickel particles having a diameter of about 10 nm is disposed on the electronic component for the catalytic formation of the SWNTs. The resulting SWNTs are aligned and have an average diameter of about 10 nm and an average length of about 100 nm. The average thickness of the graphene coating layer is approximately 20 nm.

Example 3

Graphene Coated Electronic Component

A graphene coated electronic component is prepared as follows. A plurality of graphene platelets are applied to an environment-facing surface of an electronic component. Optionally, the electronic component may also have an electrically insulating layer disposed on its surface prior to deposition of the graphene platelets. The component is then subjected to dielectrophoresis, with the gap between the electrodes varying from 10-100 μm, depending on the desired length of the micro-wires. The micro-wires form after introduction of a suspension of gold nanoparticles having a diameter of 15-30 nm into a thin chamber above planar metallic electrodes. An alternating voltage of 50 to 250 V and 50 to 200 Hz is applied to the planar electrodes, resulting the in the formation of thin metallic fibers. Conductive graphene platelets form small islands on an otherwise homogeneous substrate, causing micro-wire growth in the direction of the platelets, connecting the platelets to both electrodes.

Example 4

Graphene Coated Electronic Component

A graphene coated electronic component is prepared as follows. A graphene coating layer is applied to a surface of a cleaned electronic component by disposing a thin film of graphite oxide (GO) on the surface of the electronic component. The electronic component may optionally have an insulating layer disposed on its surface prior to deposition of the thin film of graphite oxide (GO). The thin film of graphite oxide (GO) is then subjected to a 788 nm infrared laser with a maximum power output of 5 mW inside an optical drive unit that periodically pulses an objective lens assembly to control the laser intensity. The thickness of the resulting laser scribed graphene (LSG) coating layer is determined by the laser intensity, laser pulsing frequency, pulsing duty cycle, the thinness of the graphite oxide (GO) film, and the total time the laser focuses on the graphite oxide.

Various implementations of the disclosure have been described in fulfillment of the various objectives of the disclosure. It should be recognized that these implementations are merely illustrative of the principles of the present disclosure. Numerous modifications and adaptations thereof will be readily apparent to those skilled in the art without departing from the spirit and scope of the disclosure.

That which is claimed is:

1. A method of increasing a service lifetime of an electronic apparatus disposed within a compartment of a vehicle or on an exterior of a vehicle, the method comprising:
   disposing a layer of electrically insulating material on an electronic component of the electronic apparatus;
   disposing a single graphene coating layer on the layer of electrically insulating material, the electronic component being a device chosen from an integrated circuit, transformer, resistor, capacitor, inductor, electrical connection or circuit board, the graphene coating layer being substantially continuous across the entire surface of the electronic component; and
   disposing the electronic apparatus within a compartment of a vehicle or on an exterior of the vehicle so that the graphene coating layer is exposed to an external environment, the graphene coating layer thereby protecting the electronic component from the external environment,
   wherein the single graphene coating layer consists of a single layer of graphene tubes;
   wherein the graphene tubes have a horizontal or substantially horizontal orientation;
   wherein the electronic apparatus exhibits at least a 10 percent improvement in environmental testing performance compared to an otherwise equivalent graphene coating layer-free electronic apparatus, the environmental testing performance comprising performance in a waterproofness test, acetic acid test, sugar solution test, or methyl alcohol test.

2. The method of claim 1, wherein the electronic apparatus exhibits at least a 10 percent improvement in two or more of the waterproofness test, acetic acid test, sugar solution test, and methyl alcohol test.

3. The method of claim 1, wherein the electronic apparatus is disposed within a passenger cabin or cockpit of an aircraft.

4. The method of claim 1, wherein the electronic component is an integrated circuit.

5. The method of claim 4, wherein the electronic apparatus is disposed within a passenger cabin or cockpit of an aircraft.

6. The method of claim 1, wherein the graphene layer is disposed on the exterior of the vehicle and is exposed to an external environment outside the vehicle, the vehicle being an aerospace vehicle.

7. The method of claim 6, wherein the electronic component is a sensor.

8. A method of increasing a service lifetime of an electronic apparatus disposed within a compartment of a vehicle or on an exterior of a vehicle, the method comprising:
   disposing a layer of electrically insulating material on an electronic component of the electronic apparatus;
   disposing a graphene coating layer on the layer of electrically insulating material, the electronic component being a device chosen from an integrated circuit, transformer, inductor, or circuit board, the graphene coating layer being substantially continuous across the entire surface of the electronic component; and
   disposing the electronic apparatus within a compartment of a vehicle or on an exterior of the vehicle so that the graphene coating layer is exposed to an external environment chosen from a passenger compartment, a cockpit or an environment outside the vehicle, the graphene coating layer thereby protecting the electronic component from the external environment during use of the electronic component,
   wherein the graphene coating layer consists of a plurality of graphene platelets, having a flat planar structure, and connected by micro-wires;
   wherein the graphene platelets have a diameter from 50 μm to 200 μm;
   wherein the micro-wires are formed from metallic nanoparticles, polymer microspheres, or a combination thereof.

9. The method of claim 8, wherein the electronic apparatus exhibits at least a 10 percent improvement in two or more of the waterproofness test, acetic acid test, sugar solution test, and methyl alcohol test.

10. The method of claim 8, wherein the graphene platelets have a width to length ratio from about 1:2 to about 1:7.5.

11. The method of claim 8, wherein the width to length ratio of the graphene platelets are from about 1:2.6 to about 1:7.5.

12. The method of claim 8, wherein the width to length ratio of the graphene platelets are from about 1:2 to about 1:3.

13. The method of claim 8, wherein the graphene platelets have a diameter from 50 μm to 150 μm.

14. The method of claim 8, wherein the electronic component is an integrated circuit.

15. The method of claim 14, wherein the electronic apparatus is disposed within a passenger cabin or cockpit of an aircraft.

16. The method of claim 8, wherein the graphene layer is disposed on the exterior of the vehicle and is exposed to an external environment outside the vehicle, the vehicle being an aerospace vehicle.

17. The method of claim 8, wherein the electronic apparatus exhibits at least a 10 percent improvement in environmental testing performance compared to an otherwise equivalent graphene coating layer-free electronic apparatus, the environmental testing performance comprising performance in a waterproofness test, acetic acid test, sugar solution test, or methyl alcohol test.

* * * * *